United States Patent
Du et al.

(10) Patent No.: US 9,204,532 B2
(45) Date of Patent: Dec. 1, 2015

(54) FANOUT LINE STRUCTURE OF ARRAY SUBSTRATE AND DISPLAY PANEL

(71) Applicant: SHENZHEN CHINA STAR OPTOELECTRONICS TECHNOLOGY CO., LTD, Shenzhen (CN)

(72) Inventors: Peng Du, Shenzhen (CN); Ming hung Shih, Shenzhen (CN); Jiali Jiang, Shenzhen (CN)

(*) Notice: Subject to any disclaimer, the term of this patent is extended or adjusted under 35 U.S.C. 154(b) by 224 days.

(21) Appl. No.: 14/113,582

(22) PCT Filed: Jul. 31, 2013

(86) PCT No.: PCT/CN2013/080452
§ 371 (c)(1),
(2) Date: Oct. 24, 2013

(87) PCT Pub. No.: WO2015/000202
PCT Pub. Date: Jan. 8, 2015

(65) Prior Publication Data
US 2015/0009438 A1    Jan. 8, 2015

(30) Foreign Application Priority Data
Jul. 5, 2013   (CN) .......................... 2013 1 0281983

(51) Int. Cl.
*G02F 1/1345* (2006.01)
*H05K 1/02* (2006.01)
*H05K 1/16* (2006.01)

(52) U.S. Cl.
CPC .............. *H05K 1/025* (2013.01); *G02F 1/1345* (2013.01); *H05K 1/0248* (2013.01); *H05K 1/162* (2013.01); *H05K 2201/0326* (2013.01); *H05K 2201/0391* (2013.01); *H05K 2201/09227* (2013.01); *H05K2201/09763* (2013.01); *H05K 2201/10136* (2013.01)

(58) Field of Classification Search
CPC ................ G02F 1/136286; H05K 2201/09218
USPC .................................................. 349/149–152
See application file for complete search history.

(56) References Cited

U.S. PATENT DOCUMENTS

| | | | |
|---|---|---|---|
| 6,842,200 B1 * | 1/2005 | Su et al. ......................... | 349/38 |
| 6,897,932 B2 * | 5/2005 | Murade et al. ................ | 349/151 |
| 7,893,436 B2 * | 2/2011 | Kim et al. ....................... | 257/59 |

(Continued)

FOREIGN PATENT DOCUMENTS

| | | |
|---|---|---|
| CN | 1628263 A | 6/2005 |
| CN | 102053434 A | 5/2011 |

(Continued)

OTHER PUBLICATIONS

Xie Fei, the International Searching Authority written comments, Apr. 2014, CN.

*Primary Examiner* — Hoan C Nguyen

(57) ABSTRACT

A fanout line structure of an array substrate includes first fanout lines arranged on a fanout area of the array substrate, and second fanout lines arranged on the fanout area of the array substrate. A second conducting film is arranged at a bottom of the second fanout line, a second capacitor is formed between the second conducting film and a first conducting film of the second fanout line, the second capacitor is used to reduce an impedance difference between the fanout lines. Capacitance value of the second capacitor is dependent on an overlapping area between the second conducting film and the first conducting film.

13 Claims, 5 Drawing Sheets

(56) References Cited

U.S. PATENT DOCUMENTS

2003/0227078 A1* 12/2003 Chang ........................... 257/693
2008/0157364 A1    7/2008 Yang et al.
2011/0096258 A1*  4/2011 Shim et al. ..................... 349/39

FOREIGN PATENT DOCUMENTS

| JP | H10339880 A | 12/1998 |
|----|-------------|---------|
| JP | 2007192968 A | 8/2007 |
| TW | 594177 B | 6/2004 |

* cited by examiner

FANOUT LINE STRUCTURE OF ARRAY SUBSTRATE AND DISPLAY PANEL

TECHNICAL FIELD

The present disclosure relates to the field of a display device, and more particularly to a fanout line structure of an array substrate and a display panel.

BACKGROUND

A liquid crystal display (LCD) panel is an important component of an LCD device. A driving circuit cooperating with a backlight unit drives the LCD panel to display images.

As shown in FIG. 1, FIG. 2, and FIG. 3, a thin film transistor (TFT) array area 120 is arranged on an array substrate 100 of the LCD panel, where a plurality of signal lines 13 are arranged on the TFT array area 120. A driving circuit board 130 is connected with the signal line 13 of the array substrate 100 with a bonding pad 12 of the driving circuit board 130 through a fanout line 11, and the fanout lines 11 are arranged on a fanout area.

The bonding pads 12 are closely arranged on the driving circuit board 130, but the signal lines 13 are dispersedly arranged in the TFT array area 120, namely distances between the bonding pads and different signal lines are different, which causes different resistance values of the fanout lines connected between the bonding pads and the signal lines. A waveform of a signal changes because of different lengths and resistance values of fanout lines, thereby affecting display quality of the LCD device.

SUMMARY

In view of the above-described problems, the aim of the present disclosure is to provide a display panel having a small height in a fanout area and a fanout line of an array substrate having a small height capable of obtaining good display quality and a narrow frame of a display device.

The purpose of the present disclosure is achieved by the following methods:

A fanout line structure of an array substrate comprises first fanout lines arranged on a fanout area of the array substrate, and second fanout lines arranged on the fanout area of the array substrate. A second conducting film is arranged at a bottom of the second fanout line, a second is formed between the second film and a first conducting film of the second fanout line, the second is used to reduce an impedance difference between the fanout lines. Capacitance value of the second capacitor is dependent on an overlapping area between the second conducting film and the first conducting film.

Furthermore, the first fanout line is configured with only one first conducting film, and the second fanout line is configured with only one first conducting film, which avoids electro-static discharge in a manufacturing process of the LCD panel.

Furthermore, width of the second conducting film is greater than width of the first conducting film, which is easy to be obtained, and ensures constant width of overlapping region between the second conducting film and the first conducting film.

Furthermore, width of the second conducting film is constant, and length of each of the second conducting films arranged at the bottom of different lengths of second fanout lines is different. In the present disclosure, the width of the second conducting film is constant, and the length of the second conducting film arranged at the bottom of the second fanout line is determined according to the length of the second fanout line, which easily calculates the area of the second conducting film, and then obtains the corresponding second capacitor.

Furthermore, the length of the second conducting film arranged at the bottom of the second fanout line is $L_{22}$: $L_{22}=\in_{r1}d_2(L_1^2-L_2^2)/L_2(d_1\in_{r2}-d_2\in_{r1})$, where $L_1$ is a length of the first fanout line or any one of the second fanout lines, and a fanout line having a length L1 is regarded as a reference line. $L_2$ is a length of the second fanout line, $L_{22}$ is the length of the second conducting film arranged at the bottom of the second fanout line, $\in_{r1}$ is a relative dielectric constant of a liquid crystal layer of a liquid crystal panel, $d_1$ is a thickness of the liquid crystal layer, $\in_{r2}$ is a relative dielectric constant of a dielectric medium between the second conducting film and the first conducting film, and $d_2$ is a thickness of the dielectric medium between the second conducting film and the first conducting film.

Furthermore, the reference line is a longest fanout line of all the first fanout lines or all the second fanout lines. The longest fanout line is regarded as the reference line, and area of the second conducting film of other fanout lines is calculated according to the reference line. The longest fanout line does not need be configured with the second conducting film because the resistance value of the longest fanout line itself is greatest in all the fanout lines.

Furthermore, the second conducting film is a block of second conducting film covering a plurality of fanout lines, which avoids manufacturing complicate mask pattern, and the present disclosure is easily obtained in the manufacturing process.

Furthermore, a dielectric medium between the second conducting film and the first conducting film is a passivation layer, where the passivation layer has good insulating effect.

Furthermore, in the first fanout lines and the second fanout lines, the fanout line having a short straight-line distance is configured with a bending section, which is used to increase a length of the fanout line. A waveform of the signal is affected by the resistance value R and the parasitic capacitance C of the fanout line, and a formula of the time constant $\tau$ of signal delay of the fanout line is: $\tau=RC$. Namely, if the time constant $\tau$ of signal delay of each of the fanout lines is needed to be same, the resistance value R and the parasitic capacitance C of the fanout line an be simultaneously adjusted, which may meet requirement of the process, design, and production. However, the resistance value of the fanout line is directly adjusted through changing the length of the fanout line. In the present disclosure, the impedance difference between the fanout lines is reduced through increasing the length of the fanout line and arranging the second capacitor Furthermore, the first conducting film is a metal conducting film, and the second conducting film is an indium tin oxide conducting film or a metal conducting film. The metal conducting film has a good conducting effect and small influence on the signal delay. In a process of manufacturing a panel of fringe field switching (FFS), the addition conducting film employing the ITO conducting film can be arranged because a bottom of an array substrate of the FFS panel is the ITO conducting film. The second conducting film employing the metal conducting film can be arranged in a process of manufacturing the array substrate, such as in a process of arranging the metal conducting film of the TFT or the metal conducting film of other signal lines. The above-mentioned methods are obtained in condition of simply adjusting an etching process without adding new mask process.

A fanout line structure of an array substrate comprises a first fanout line arranged on a fanout area of the array substrate, and a second fanout line arranged on the fanout area of the array substrate. The second fanout line comprises a second conducting film arranged at a bottom of the array substrate, a first insulating layer arranged on the second conducting film, a first conducting film arranged on the first insulating layer, and a second insulating layer arranged on the first conducting film. A second capacitor is formed between the second conducting film and the first conducting film of the second fanout line, the second capacitor is used to reduce an impedance difference between the fanout lines. Capacitance value of the second capacitor is dependent on an overlapping area between the second conducting film and the first conducting film.

A display panel comprises any one of the above-mentioned fanout line structures.

In the present disclosure, the second conducting film is arranged at the bottom of the second fanout line, and the second capacitor is formed between the second conducting film and the first conducting film of the second fanout line. A resistor-capacitor (RC) delay is caused by the second capacitor to a signal transferred by the fanout line. Thus, the fanout line having a small resistance value may increase an impedance of the fanout line through a great second capacitor, which allows the signal transferred by the fanout line having the small resistance value to delay, and then synchronizes the signal transferred by the fanout line having the small resistance value with the signal transferred by the fanout line having a great resistance value. Additionally, the second conducting film arranged at the bottom of the fanout line can be obtained in the mask process of manufacturing the LCD panel, the ITO conducting film and the metal conducting film formed in the mask process can be simultaneously formed at the fanout line region to be regarded as the second conducting film.

DETAILED DESCRIPTION

The present disclosure will further be described in detail in accordance with the figures and the exemplary examples.

Example 1

Figure 1:
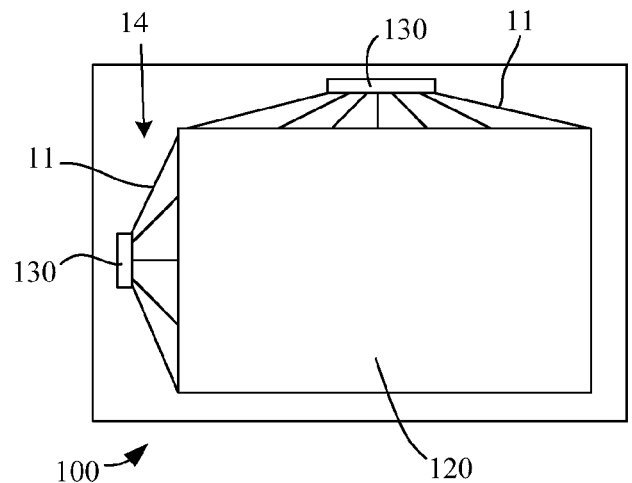
FIG. 1 is a structural diagram of an array substrate of a typical liquid crystal display (LCD) panel.
Figure 2:
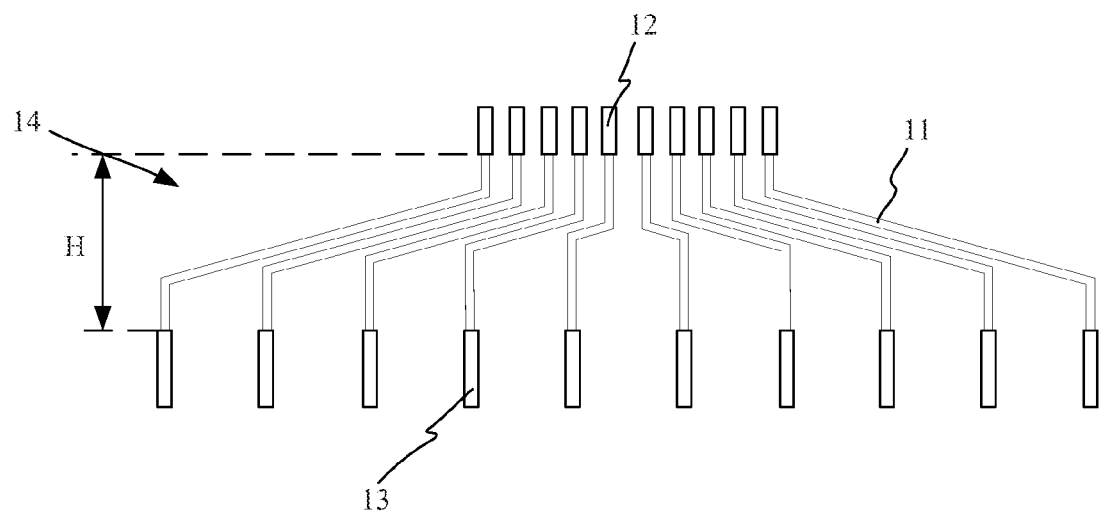
FIG. 2 is a structural diagram of a fanout line in a fanout area of an array substrate of a typical liquid crystal display (LCD) panel.
Figure 4:
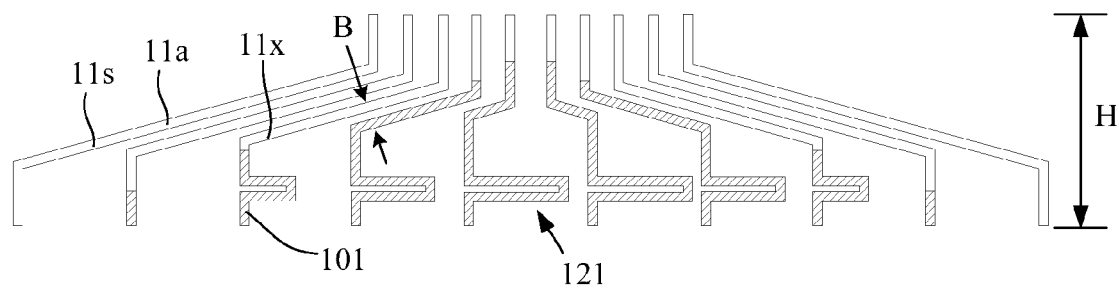
FIG. 4 is a structural diagram of a fanout line of an LCD panel of a first example of the present disclosure.
Figure 5:
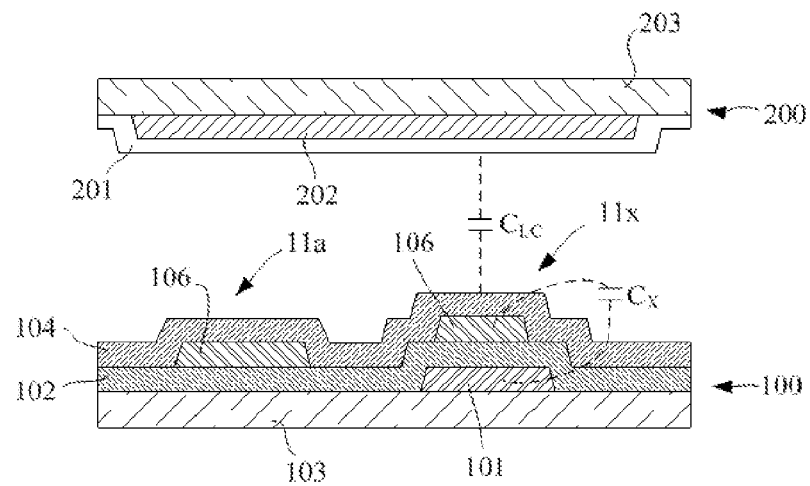
FIG. 5 is a cross sectional view of a fanout line along direction B as shown in FIG. 4.

As shown in FIG. 4 and FIG. 5, and with reference to FIG. 1 and FIG. 2, a first example provides a liquid crystal display (LCD) panel comprising an array substrate 100 and a color filter substrate 200, where the color filter substrate 200 comprises a second glass substrate 203, a black matrix 202, and an indium tin oxide (ITO) conducting film 201. An area comprising a plurality of fanout lines of the array substrate 100 is regarded as a fanout area (as shown in FIG. 1), in the fanout area, a plurality of first fanout lines 11a and a plurality of second fanout lines 11x are arranged on a first glass substrate 103. A second conducting film 101 is arranged at a bottom of the second fanout line 11x, and a second capacitor Cx is formed between the second conducting film 101 and a first conducting film 106 of the second fanout line 11x. Capacitance value of the second capacitor Cx is dependent on an overlapping area between the second conducting film 101 and the first conducting film 106. In the first example, the second capacitor Cx is used to reduce impedance difference between the fanout lines, such as between the first fanout line 11a and the second fanout line 11x, or between the second fanout lines 11x.

The second conducting film 101 is arranged at a bottom of the array substrate 100, a first insulating layer 102 is a dielectric medium and is arranged between the second conducting film 101 and the first conducting film 106. The first insulating layer 102 is a gate insulating layer (GI) formed on the array substrate 100, and is arranged on the second conducting film 101. The first conducting film 106 is arranged on the first insulating layer 102, and a second insulating layer 104 is arranged on the first conducting film 106 to protect the first conducting film 106. The second insulating layer 104 uses a passivation layer (PAV) having a good insulating effect. The second conducting film 101 can be connected to a common electrode, a ground terminal, and other electrode.

As shown in FIG. 4, the addition conducting films 101 arranged at the bottom of different second fanout line 11x are different. Length and resistance value of the fanout line are directly proportional: when length of the fanout line increases, the corresponding resistance value of the fanout line increases. Area of the second conducting film 101 arranged at the bottom of a long second fanout line 11x having a longer length than a short second fanout line 11x is less than the area of the second conducting film 101 arranged at the bottom of a short second fanout line 11x, (as shown in FIG. 4). Overlapping areas between the second conducting films 101 and the first conducting films 106 of the second fanout lines 11x are different, thus, the second capacitors Cx formed between the second conducting films 101 and the first conducting films 106 are different. The second capacitor Cx is a parasitic capacitance, and a resistor-capacitor (RC) delay is caused by the parasitic capacitance to a signal transferred by the second fanout line 11x. Thus, the second fanout line 11x having a smaller resistance value than the first fanout line 11a may delay transferring the signal through the second capacitor Cx, which allows the signal transferred by the second fanout line 11x to synchronize with the signal transferred by the first fanout line 11a having a great resistance value, where the first fanout line 11a having the great resistance value itself has longer delay time than the second fanout line having the small resistance value. A formula for calculating a time constant τ of signal delay of the fanout line is: τ=RC, where R is the resistance value of the fanout line, and C is the capacitance value of the fanout line. Namely, the signal delay time of the fanout line depends on the resistance value of the fanout line and the capacitance value of the fanout line. Thus, the signal transferred by the second fanout line 11x can synchronize with the signal transferred by the first fanout line 11a through forming the second capacitor on the second fanout line.

Figure 3:
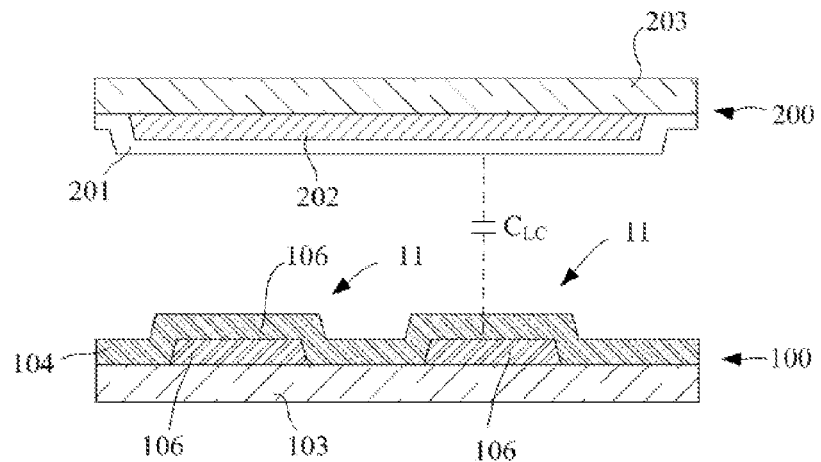
FIG. 3 is a cross sectional view of a fanout line along direction A as shown in FIG. 2.

Because the length of the first fanout line 11a and the length of the second fanout line 11x are different, and the lengths of the different second fanout lines 11x are also different, the resistance values of different fanout lines are different. Thus, if the signals transferred by the fanout lines are synchronized, the second capacitors Cx arranged on each of the fanout lines 11 are different. The capacitance value of the second capacitor is relative to the overlapping area between the second conducting film arranged at a bottom of the array substrate and the first conducting film 106. As shown in FIG. 3 and FIG. 5, a parasitic capacitance $C_{LC}$ is formed between the first fanout line 11a without the second conducting film 101 and the ITO conducting film 201 of the color filter substrate 200, and between the second fanout line 11x and the ITO conducting film 201 of the color filter substrate 200. The parasitic capacitance $C_{LC}$ is formed by the first conducting film 106 and the ITO conducting film 201. Capacitance value of the parasitic capacitance $C_{LC}$ is far less than capacitance value of the second capacitor $C_X$ because of a great thickness of a liquid crystal layer, thus, the parasitic capacitance $C_{LC}$ causes a small RC delay. However, in order to improve accuracy of delay calculation, the parasitic capacitance should be considered. A formula for calculating the parasitic capacitance between the fanout line 11 and the ITO conducting film 201 of the color filter substrate 200 is:

$$C = \frac{\varepsilon_0 \cdot \varepsilon_r \cdot S}{d} = \frac{\varepsilon_0 \cdot \varepsilon_r \cdot L \cdot W}{d}$$

where $\varepsilon_0$ is an absolute dielectric constant, $\varepsilon_r$ is a relative dielectric constant of the liquid crystal layer, L is the length of the fanout line, W is a width of the fanout line, and d is the thickness of the liquid crystal layer, where d is generally in a range of 3-4 μm The present disclosure will further be described in detail in accordance with calculating the area of the second conducting film arranged at the bottom of the second fanout line 11x.

In order to simplify calculation, the width of the second conducting film 101 is constant, and the length of each of the second conducting films 101 arranged at the bottom of different lengths of second fanout lines 11x is different. In the first example, the width of the second conducting film 101 is same as the width of the second fanout line 11x, thus, the width of the second conducting film is the same as a width of the overlapping area between the first conducting film 106 and the second conducting film 101, which simplifies calculating the capacitance value of the second capacitor.

In order to determine an overlay length of the second capacitor of the second fanout line 11x, one fanout line is chosen from all the fanout lines as a reference line. As shown in FIG. 4, the first example chooses a longest fanout line 11s from the first fanout lines 11a as the reference line. The capacitance value of the second capacitor formed between the second conducting film 101 arranged at the bottom of the second fanout line 11x and the first conducting film 106 arranged in the second fanout line 11x is calculated by choosing the longest fanout line 11s as the reference line, and the length of the second conducting film 101 arranged at the bottom of the second fanout line 11x is further calculated. If a resistance value of the longest fanout line 11s (the reference line) is $R_1$ and a resistance value of the second fanout line 11x is $R_2$, formulas for calculating the $R_1$ and $R_2$ are:

$$R_1 = \frac{R_S \cdot L_1}{W},$$

and $$R_2 = \frac{R_S \cdot L_2}{W}$$

For the longest fanout line 11s without any second conducting film, as shown in FIG. 3, FIG. 4, and FIG. 5, the parasitic capacitance of the longest fanout line 11s is mainly formed by the first conducting film 106 of the fanout line 11 and the ITO conducting film 201 of the color filter substrate 200, where the parasitic capacitance is regarded as $C_1$ (namely $C_{LC}$), capacitance value of the parasitic capacitance is:

$$C_1 = \frac{\varepsilon_0 \cdot \varepsilon_{r1} \cdot L_1 \cdot W}{d_1}$$

where $\varepsilon_0$ is an absolute dielectric constant, $\varepsilon_{r1}$ is a relative dielectric constant of the liquid crystal layer of the LCD panel, $L_1$ is a length of the longest fanout line 11s of the first fanout line 11a, W is a width of the longest fanout line 11s of the first fanout line 11a, and $d_1$ is the thickness of the liquid crystal layer. $L_1$ is calculated by a fanout tool (the fanout tool is a special tool for a designer). For the longest fanout line 11s of the first fanout line 11a, a formula for calculating time constant $\tau_1$ of the fanout line 11s is:

$$\tau_1 = R_1 \cdot C_1 = \frac{R_S \cdot \varepsilon_o \cdot \varepsilon_{r1} \cdot L_1^2}{d_1}$$

The time constant $\tau_1$ and square of $L_1$ are directly proportional, a following result is obtained: the fanout line 11s of two sides of entire fanout area is the longest, and the time constant $\tau_1$ of the longest fanout line 11s is greatest. The time constant $\tau_1$ is regarded as a reference in the formula, which allows to easily calculate the length of each of the second conducting films arranged at the bottom of other second fanout lines.

The length of the second fanout line 11x without the second conducting film 101 is regarded as $L_{21}$, and the length of the second fanout line 11x having the second conducting film 101 is regarded as $L_{22}$, relationship of the $L_{21}$ and the $L_{22}$ is:

$$L_2 = L_{21} + L_{22}$$

Capacitance value of the parasitic capacitance $C_{21}$ of the second fanout line 11x without the second conducting film 101 (the parasitic capacitance $C_{21}$ is formed between the first conducting film 106 and the ITO conducting film of the color filter substrate) is:

$$C_{21} = \frac{\varepsilon_o \cdot \varepsilon_{r1} \cdot L_{21} \cdot W}{d_1}$$

Capacitance value of the second capacitor $C_{22}$ of the second fanout line 11x having the second conducting film 101 is:

$$C_{22} = \frac{\varepsilon_o \cdot \varepsilon_{r2} \cdot L_{22} \cdot W}{d_2}$$

In the formula, $\varepsilon_{r2}$ is a relative dielectric constant of the first insulating layer 102, and $d_2$ is the thickness of the first insulating layer 102. The relative dielectric constant of the first insulating layer 102 is close to the relative dielectric constant of the LC molecular layer. However, the thickness of the first insulating layer 102 is small, thus, in condition of same area, capacitance value of a new second capacitor Cx is far greater than capacitance value of the parasitic capacitance $C_{LC}$ formed between the fanout line and the ITO conducting film of the color filter substrate. As shown in FIG. 5, in the first example, the capacitance value of the second capacitor Cx is about ten times the capacitance value of the parasitic capacitance $C_{LC}$. The capacitor $C_{21}$ is connected with the capacitor $C_{22}$ in parallel. Capacitance value the capacitor $C_2$ of the entire fanout line 11x is:

$$C_2 = C_{21} + C_{22}$$

When adjusting impedance of the fanout line, the time constant $\tau_1$ of the fanout line 11s is regarded as the reference:

$$\tau_2 = R_2 \cdot C_2 = \tau_1$$

thus, formulas obtained according to the above-mentioned equation as follow:

$$L_{21} = \frac{\varepsilon_{r1} d_2 L_1^2 - \varepsilon_{r2} d_1 L_2^2}{L_2 (d_2 \varepsilon_{r1} - d_1 \varepsilon_{r2})}$$

$$L_{22} = \frac{\varepsilon_{r1} d_2 (L_1^2 - L_2^2)}{L_2 (d_1 \varepsilon_{r2} - d_2 \varepsilon_{r1})}$$

where $L_{22}$ is the length of the second conducting film 101 arranged at the bottom of the second fanout line 11x. Thus, area S of the second conducting film 101 arranged at the bottom of the second fanout line 11x is: $S = WL_{22}$.

In the first example, the first conducting film 106 is a metal conducting film having good conducting effect and small signal delay, the second conducting film 101 may employ the indium tin oxide film (ITO) or the metal conducting film.

Additionally, in the first example, the first fanout line 11a is configured with only one conducting film (namely the first conducting film 106) to transfer the signal, and the second fanout line 11x is also configured with only one conducting film (namely the first conducting film 106) to transfer the signal, which avoids electro-static discharge in a manufacturing process of the LCD panel.

In a manufacturing process of a panel of fringe field switching (FFS), the addition conducting film employing the ITO conducting film can be arranged because a bottom of an array substrate of the FFS panel is the ITO conducting film. The second conducting film employing the metal conducting film can be arranged in a manufacturing process of the array substrate, such as in a process of arranging the metal conducting film of the TFT or the metal conducting film of other signal lines. The above-mentioned methods are obtained in condition of simply adjusting an etching process without new mask process.

A waveform of the signal is affected by the resistance value R and the parasitic capacitance C of the fanout line, and a formula of the time constant τ of signal delay of the fanout line is: τ=RC. Namely, if the time constant τ of signal delay of each of the fanout lines is needed to be same, the resistance value R and the parasitic capacitance C of the fanout line can be simultaneously adjusted, which may meet requirement of the process, design, and production. As shown in FIG. 4, on a basis of the first example, the impedance difference can be reduced through reducing the length difference between the fanout lines. Straight-line distances between two endpoints of different fanout lines are different. Taking the first fanout line 11a and the second fanout line 11x for example, the straight-line distance between two endpoints of the second fanout line 11x is shorter than the straight-line distance between two endpoints of the first fanout line 11a. Thus, in the first example, the fanout line 11x is configured with a bending section 121 to increase the length of the fanout line 11x, at the same time, the second capacitor Cx is formed by the second conducting film 101 arranged at the bottom of the second fanout line, which reduces length of the coiling of the fanout line. If the resistance value and the time constant of the second fanout line 11x are far less than the resistance value and the time constant of the first fanout line 11a, the second conducting film 101 is arranged at the bottom of the second fanout line 11x and the length of the coiling of the fanout line increases, which is suitable for a large size of the LCD television, thereby avoiding great height H of the fanout area because of more coilings and synchronizing signal.

Example 2

Figure 6:
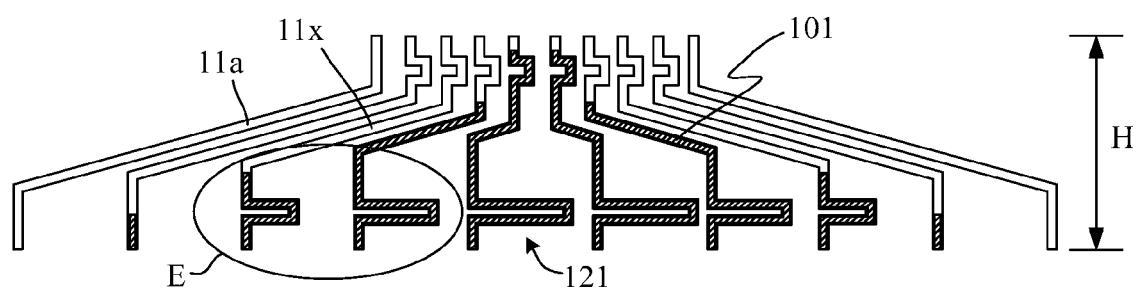
FIG. 6 is a structural diagram of a fanout line of a second example of the present disclosure.
Figure 7:
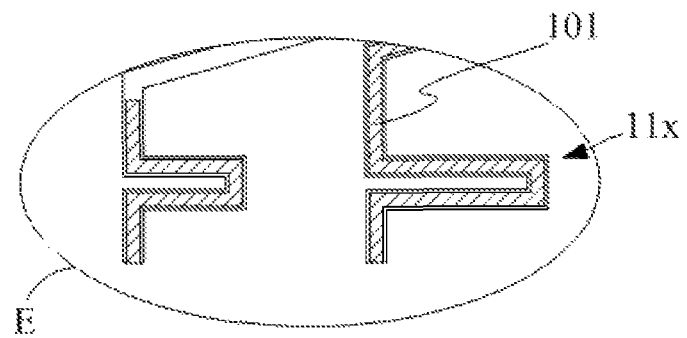
FIG. 7 is a local enlarged diagram of a fanout line of FIG. 4 taken from E.

As shown in FIG. 6 and FIG. 7, a difference between the first example and a second example as follows: the width of the second conducting film 101 is less than the width of the second fanout line 11x in the second example. In a condition that the width of the second conducting film is less than the width of the fanout line, it should be considered that different width of the second conducting film can be chosen according to a size of the panel and requirement of the process.

Example 3

Figure 8:
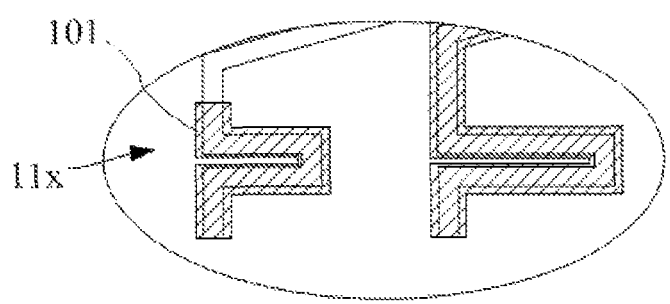
FIG. 8 is a structural diagram of a fanout line having a second conducting film of a third example of the present disclosure

FIG. 8 is a schematic diagram of a third example. The width of the second conducting film 101 is greater than the width of the second fanout line 11x, which allows the width of the overlapping area between the second conducting film 101 and the first conducting film is same as the width of the first conducting film, thereby improving accuracy of calculating the second capacitor.

Example 4

Figure 9:
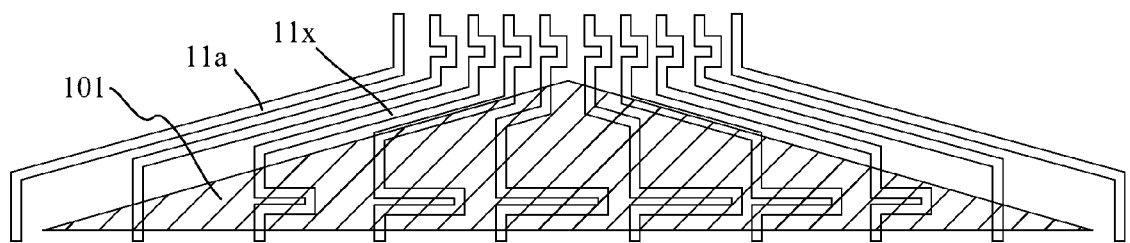
FIG. 9 is a structural diagram of a first fanout line having a second conducting film of a fourth example of the present disclosure.

As shown in FIG. 9, a fourth example is different from the above-mentioned examples, in the fourth example, a block of second conducting film 101 is arranged at the bottom of a plurality of fanout lines to obtain the second capacitor, the block of second conducting film 101 is triangle shape, the fourth example simplifies manufacturing process without any complicated mask process, thereby reducing cost.

Figure 10:
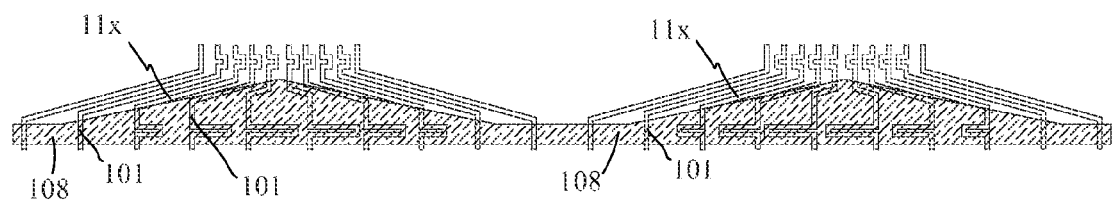
FIG. 10 is a structural diagram of a second fanout line having a second conducting film of a fourth example of the present disclosure.
Figure 11:
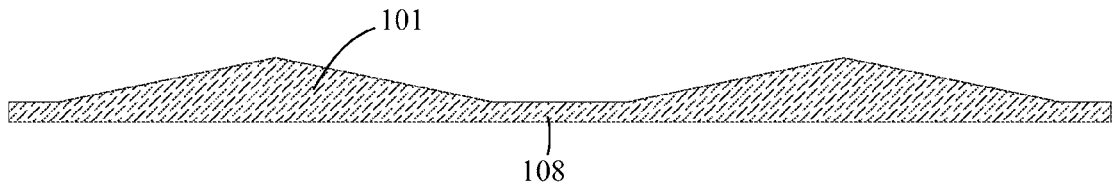
FIG. 11 is a structural diagram of a common line in FIG. 10.

Additionally, in the design of the LCD panel having narrow-frame, the fanout line and a common line are overlapped in order to save space, thus, the second conducting film 101 and the common line are simultaneously arranged. As shown in FIG. 10 and FIG. 11, an overlapping region between the common line 108 and each of the second fanout lines 11x is arranged a block of second conducting film 101, where shape of the block of second conducting film 101 is triangle, which allows the capacitance values of the second capacitors Cx formed on the different second fanout lines are different.

According to the above-mentioned formula for calculating the length of the second conducting film, capacitance value of the second capacitor of each of the second fanout lines can be closed to a calculating result of the above-mentioned formula when an obtuse angle of the block of second conducting film of triangle is adjusted, which reduces the impedance difference between the fanout lines. It should be considered that the shape of the block of second conducting film is not limited to be triangle, the shape of the block of second conducting film may be also hyperbola, oval in a region of the obtuse angle of triangle, parabola, and the like.

The present disclosure is described in detail in accordance with the above contents with the specific exemplary examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

We claim:

1. A fanout line structure of an array substrate, comprising:
   first fanout lines arranged on a fanout area of the array substrate; and
   second fanout lines arranged on the fanout area of the array substrate;
   wherein a second conducting film is arranged at a bottom of the second fanout line, a second capacitor is formed between the second conducting film and a first conducting film of the second fanout line; capacitance value of the second capacitor is dependent on an overlapping area between the second conducting film and the first conducting film; wherein width of the second conducting film is constant, and length of each of the second conducting films arranged at the bottom of different lengths of second fanout lines is different;
   wherein the length of the second conducting film arranged at the bottom of the second fanout line is $L_{22}$:

$$L_{22}=\in_{r1}d_2(L_1^2-L_2^2)/L_2(d_1\in_{r2}-d_2\in_{r1});$$

wherein $L_1$ is a length of the first fanout line or any one of the second fanout lines, and a fanout line having a length L1 is regarded as a reference line; $L_2$ is a length of the second fanout line, $L_{22}$ is the length of the second conducting film arranged at the bottom of the second fanout line $\in_{r1}$ is a relative dielectric constant of a liquid crystal layer of a liquid crystal panel, $d_1$ is a thickness of the liquid crystal layer, $\in_{r2}$ is a relative dielectric constant of a dielectric medium between the second conducting film and the first conducting film, and $d_2$ is a thickness of the dielectric medium between the second conducting film and the first conducting film.

2. The fanout line structure of the array substrate of claim 1, wherein the first fanout line is configured with only one first conducting film, and the second fanout line is configured with one first conducting film.

3. The fanout line structure of the array substrate of claim 1, wherein the reference line is a longest fanout line of all the first fanout lines or all the second fanout lines.

4. The fanout line structure of the array substrate of claim 1, wherein the second conducting film is a block of second conducting film covering a plurality of the fanout lines.

5. The fanout line structure of the array substrate of claim 1, wherein in the first fanout lines and the second fanout lines, the fanout line having a shorter straight-line distance than other fanout line is configured with a bending section, and the bending section is used to increase a length of the fanout line.

6. The fanout line structure of the array substrate of claim 1, wherein the first conducting film is a metal conducting film, and the second conducting film is an indium tin oxide conducting film or a metal conducting film.

7. A fanout line structure of an array substrate, comprising:
   first fanout lines arranged on a fanout area of the array substrate; and
   second fanout lines arranged on the fanout area of the array substrate;
   wherein the second fanout line comprises a second conducting film arranged at a bottom of the array substrate, a first insulating layer arranged on the second conducting film, a first conducting film arranged on the first insulating layer, and a second insulating layer arranged on the first conducting film; a second capacitor is formed between the second conducting film and the first conducting film of the second fanout line; capacitance value of the second capacitor is dependent on an overlapping area between the second conducting film and the first conducting film; wherein width of the second conducting film is constant, and length of each of the second conducting films arranged at the bottom of different lengths of second fanout lines is different;
   wherein the length of the second conducting film arranged at the bottom of the second fanout line is $L_{22}$:

$$L_{22}=\in_{r1}d_2(L_1^2-L_2^2)/L_2(d_1\in_{r2}-d_2\in_{r1});$$

wherein $L_1$ is a length of the first fanout line or any one of the second fanout lines, and a fanout line having a length L1 is regarded as a reference line; $L_2$ is a length of the second fanout line, $L_{22}$ is the length of the second conducting film arranged at the bottom of the second fanout line $\in_{r1}$ is a relative dielectric constant of a liquid crystal layer of a liquid crystal panel, $d_1$ is a thickness of the liquid crystal layer, $\in_{r2}$ is a relative dielectric constant of a dielectric medium between the second conducting film and the first conducting film, and $d_2$ is a thickness of the dielectric medium between the second conducting film and the first conducting film.

8. A display panel, comprising:
   first fanout lines arranged on a fanout area of the array substrate; and
   second fanout lines arranged on the fanout area of the array substrate;
   wherein a second conducting film is arranged at a bottom of the second fanout line, a second capacitor is formed between the second conducting film and a first conducting film of the second fanout line; capacitance value of the second capacitor is dependent on an overlapping area between the second conducting film and the first conducting film; wherein width of the second conducting film is constant, and length of each of the second conducting films arranged at the bottom of different lengths of second fanout lines is different;
   wherein the length of the second conducting film arranged at the bottom of the second fanout line is $L_{22}$:

$$L_{22}=\in_{r1}d_2(L_1^2-L_2^2)/L_2(d_1\in_{r2}-d_2\in_{r1});$$

wherein $L_1$ is a length of the first fanout line or any one of the second fanout lines, and a fanout line having a length L1 is regarded as a reference line; $L_2$ is a length of the second fanout line, $L_{22}$ is the length of the second conducting film arranged at the bottom of the second fanout line $\in_{r1}$ is a relative dielectric constant of a liquid crystal layer of a liquid crystal panel, $d_1$ is a thickness of the liquid crystal layer, $\in_{r2}$ is a relative dielectric constant of a dielectric medium between the second conducting film and the first conducting film, and $d_2$ is a thickness of the dielectric medium between the second conducting film and the first conducting film.

9. The display panel of claim 8, wherein the first fanout line is configured with only one first conducting film, and the second fanout line is configured with only one first conducting film.

10. The display panel of claim 8, wherein the reference line is a longest fanout line of all the first fanout lines or all the second fanout lines.

11. The display panel of claim 8, wherein the second conducting film is a block of second conducting film covering a plurality of the fanout lines.

12. The display panel of claim 8, wherein in the first fanout lines and the second fanout lines, the fanout line having a shorter straight-line distance than other fanout line is configured with a bending section, and the bending section is used to increase a length of the fanout line.

13. The display panel of claim 8, wherein the first conducting film is a metal conducting film, and the second conducting film is an indium tin oxide conducting film or a metal conducting film.

* * * * *